US009017154B2

(12) United States Patent  (10) Patent No.: US 9,017,154 B2
Moss et al.  (45) Date of Patent: Apr. 28, 2015

(54) CHASSIS HAVING AN INTERNAL AIR PLENUM AND AN ARRANGEMENT OF MULTIPLE CHASSIS TO FORM A VERTICAL AIR PLENUM

(75) Inventors: David L. Moss, Austin, TX (US); Shawn P. Hoss, Round Rock, TX (US)

(73) Assignee: Dell Products L.P., Round Rock, TX (US)

(*) Notice: Subject to any disclaimer, the term of this patent is extended or adjusted under 35 U.S.C. 154(b) by 1846 days.

(21) Appl. No.: 11/777,608

(22) Filed: Jul. 13, 2007

(65) Prior Publication Data

US 2009/0016016 A1 Jan. 15, 2009

(51) Int. Cl.
  *H05K 7/20* (2006.01)
  *G06F 1/20* (2006.01)

(52) U.S. Cl.
  CPC ..... *H05K 7/20745* (2013.01); *A47B 2200/0019* (2013.01); *G06F 1/20* (2013.01); *H05K 7/20736* (2013.01)

(58) Field of Classification Search
  USPC .......................... 454/184, 154; 361/687, 692
  See application file for complete search history.

(56) References Cited

U.S. PATENT DOCUMENTS

| | | | | |
|---|---|---|---|---|
| 4,774,631 | A | * | 9/1988 | Okuyama et al. ............. 361/695 |
| 5,216,579 | A | * | 6/1993 | Basara et al. ............ 361/679.46 |
| 5,559,673 | A | * | 9/1996 | Gagnon et al. ................ 361/695 |
| 5,751,549 | A | | 5/1998 | Eberhardt et al. |
| 6,011,701 | A | * | 1/2000 | Kopp et al. .................... 361/818 |
| 6,336,691 | B1 | * | 1/2002 | Maroney et al. .............. 312/236 |
| 6,381,147 | B1 | * | 4/2002 | Hayward et al. .............. 361/756 |
| 6,496,366 | B1 | | 12/2002 | Coglitore et al. |
| 6,741,467 | B2 | | 5/2004 | Coglitore et al. |
| 6,801,430 | B1 | * | 10/2004 | Pokharna ...................... 361/695 |
| 6,822,859 | B2 | | 11/2004 | Coglitore et al. |
| 7,123,477 | B2 | * | 10/2006 | Coglitore et al. .......... 361/679.5 |
| 7,173,817 | B2 | * | 2/2007 | Wei .......................... 361/679.48 |
| 7,355,847 | B2 | | 4/2008 | Coglitore et al. |
| 7,652,891 | B2 | * | 1/2010 | Lucero et al. ................. 361/752 |
| 7,766,733 | B2 | * | 8/2010 | Kasahara et al. ............. 454/184 |
| 2005/0168945 | A1 | | 8/2005 | Coglitore |
| 2006/0176664 | A1 | * | 8/2006 | Casebolt ....................... 361/687 |
| 2007/0236879 | A1 | * | 10/2007 | Kumano et al. .............. 361/687 |

OTHER PUBLICATIONS

Moss, Guidelines for Assessing Power and Cooling Requirements in the Data Center, Dell Power Solutions, Aug. 2005, 62-65, available at http://research.iu.hio.no/viewvc/trunk/power-Moss.pdf?revision=1 &root=HVLabCompendium.
Artman et al., Dell PowerEdge 1650: Rack Impacts on Cooling for High Density Servers, Dell White Paper, Aug. 2002, available at info.web-direct.nl/Docs/Documenten/overige/rack_coolingdense.doc.

* cited by examiner

*Primary Examiner* — Gregory Huson
*Assistant Examiner* — Nikhil Mashruwala
(74) *Attorney, Agent, or Firm* — Baker Botts L.L.P.

(57) ABSTRACT

A chassis and rack system is disclosed in which a chassis separated into two separate enclosures by a central partition. Each of the enclosures is sized to receive a computer system. The partition includes a pair of vertically oriented vents, with each of the vents in fluid communication with one of the enclosures and the computer system contained therein. Heated air is removed from each computer system through the vent in the partition that is associated with the computer system. Multiple chassis may be placed one atop another in a vertical configuration in which each chassis is either directly above or directly below another chassis. In this vertical configuration, the vents form a vertically oriented common plenum that can be used to evacuate air from multiple chassis arranged in a rack.

15 Claims, 3 Drawing Sheets

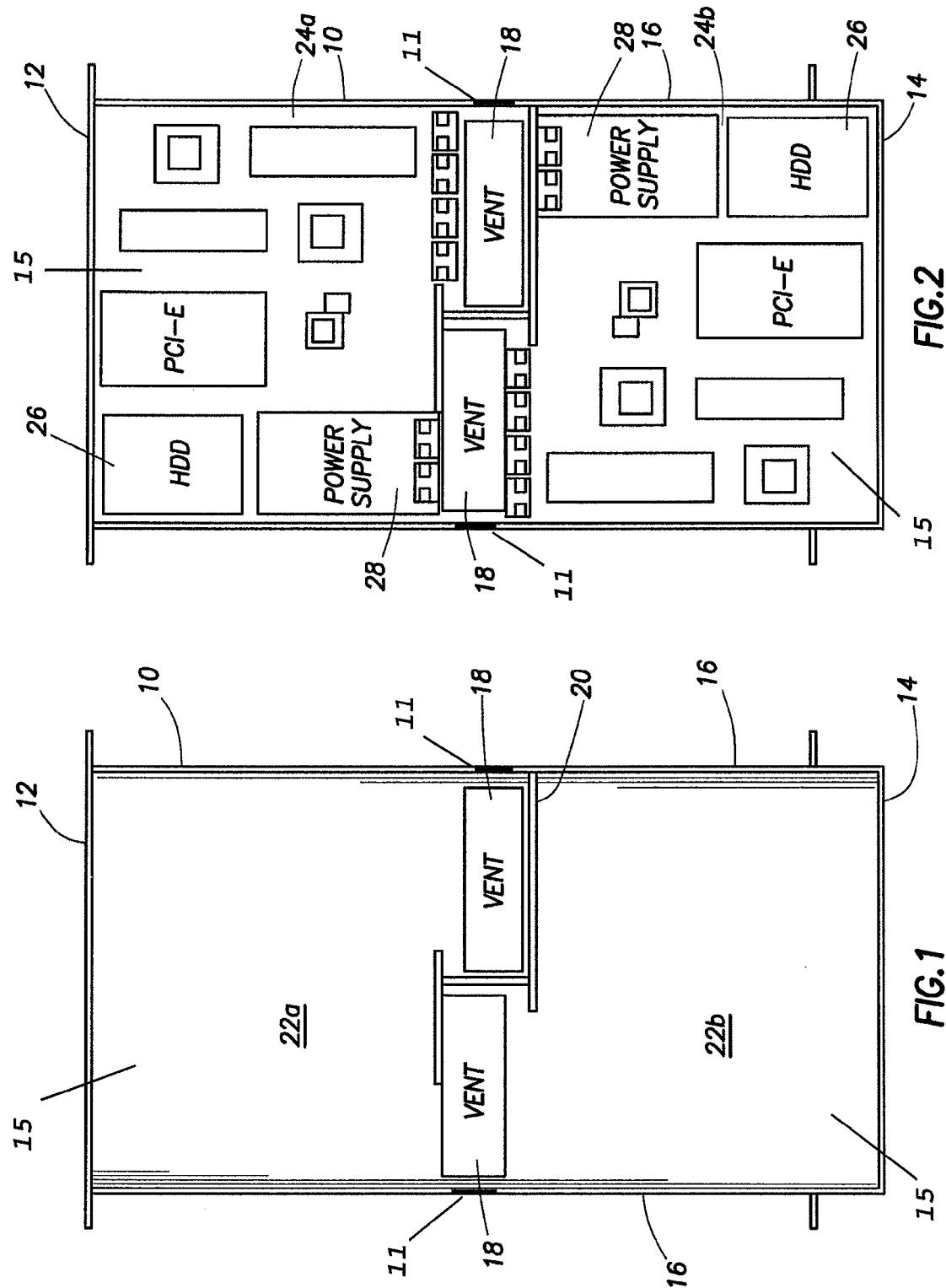

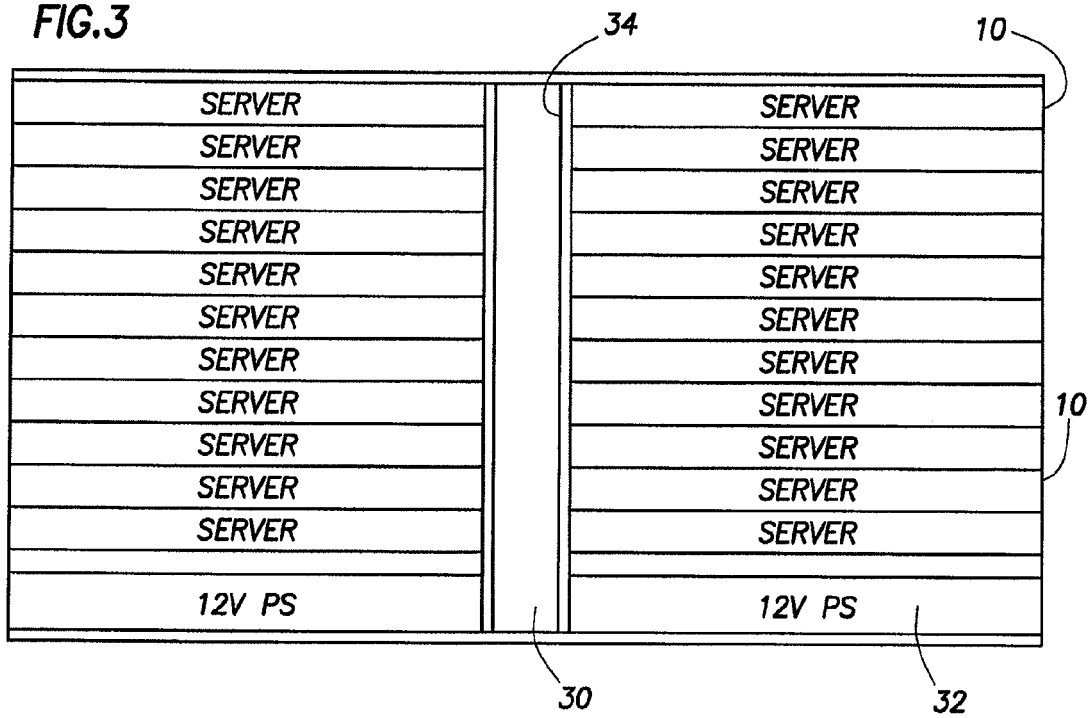
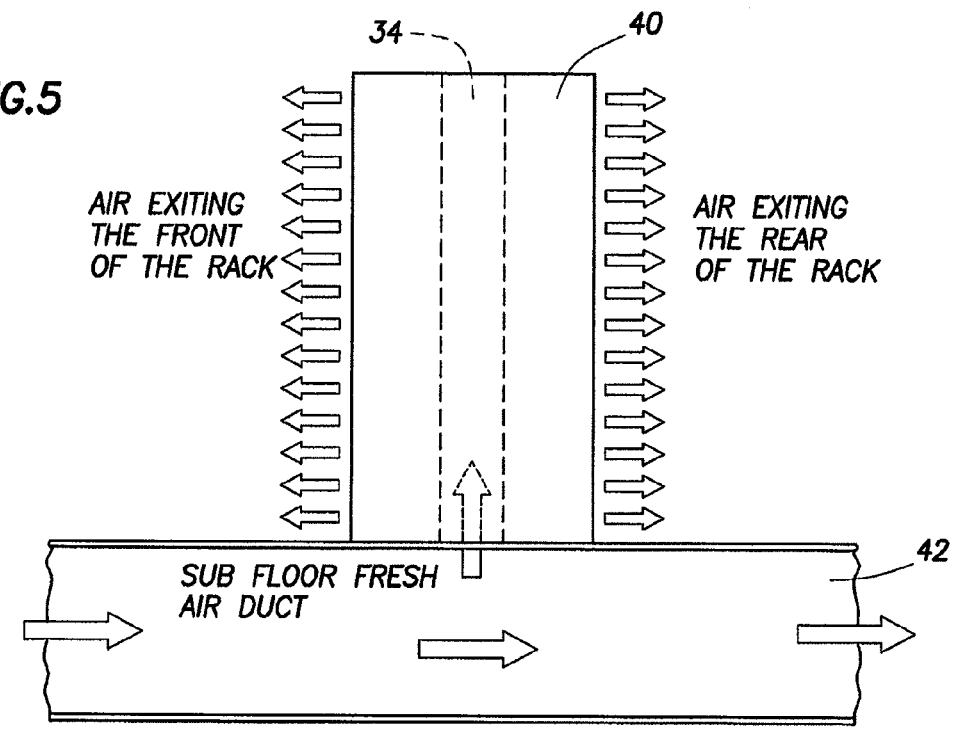

CHASSIS HAVING AN INTERNAL AIR PLENUM AND AN ARRANGEMENT OF MULTIPLE CHASSIS TO FORM A VERTICAL AIR PLENUM

TECHNICAL FIELD

The present disclosure relates generally to computer systems and information handling systems, and, more particularly, to a chassis having an internal air plenum and an arrangement of multiple chassis to form a vertical air plenum in a rack.

BACKGROUND

As the value and use of information continues to increase, individuals and businesses seek additional ways to process and store information. One option available to these users is an information handling system. An information handling system generally processes, compiles, stores, and/or communicates information or data for business, personal, or other purposes thereby allowing users to take advantage of the value of the information. Because technology and information handling needs and requirements vary between different users or applications, information handling systems may vary with respect to the type of information handled; the methods for handling the information; the methods for processing, storing or communicating the information; the amount of information processed, stored, or communicated; and the speed and efficiency with which the information is processed, stored, or communicated. The variations in information handling systems allow for information handling systems to be general or configured for a specific user or specific use such as financial transaction processing, airline reservations, enterprise data storage, or global communications. In addition, information handling systems may include or comprise a variety of hardware and software components that may be configured to process, store, and communicate information and may include one or more computer systems, data storage systems, and networking systems.

The physical frame of an information handling system is known as the chassis. An information handling system, including its chassis, is typically housed with a rack. A rack is a structure that is able to house multiple information handling systems, with each system occupying one or more slots in the rack. Multiple racks can be housed within a single room or data center. The design of the rack typically allows access to and removal of each system from the rack.

One difficulty of data centers is the heat generated by the multiple computer systems in the data center. Excessive heat leads to high cooling costs for a data center and can result in the degradation in the performance of the computer systems of the rack or data center. In an effort to remove heat from a data center having multiple racks, racks having a sizeable depth have been arranged in a cooling center along parallel lines in a row so that the heat from two adjacent racks is expelled into a common area between the racks, which area is known as the hot aisle. Directly opposite the hot aisle, on the other side of each row of racks is a cool aisle, which is distinguished by the fact that no heated air is expelled from a rack into the cool aisle. Although the arrangement of rows of racks to create alternating and wide hot aisles and cool aisles creates some advantages in the management of heat generated by the computer systems of the data center, this arrangement has a large footprint and consumes a substantial amount of floor space in the data center, thereby reducing the number of computer systems that can be housed within the available space of the data center.

SUMMARY

In accordance with the present disclosure, a chassis and rack system is disclosed in which a chassis separated into two separate enclosures by a central partition. Each of the enclosures is sized to receive a computer system. The partition includes a pair of vertically oriented vents, with each of the vents in fluid communication with one of the enclosures and the computer system contained therein. Heated air is removed from each computer system through the vent in the partition that is associated with the computer system. Multiple chassis may be placed one atop another in a vertical configuration in which each chassis is either directly above or directly below another chassis. In this vertical configuration, the vents form a vertically oriented common plenum that can be used to evacuate air from multiple chassis arranged in a rack, such as a rack in a data center. In this manner, fresh air could be supplied to the lower portion of the plenum, and heated air could be removed from the top portion of the plenum.

The chassis and rack design disclosed herein is technically advantageous. The chassis design is in the form of a sleeve that accommodates two separate computer systems, separated from one another by a plenum. Because the server systems can be stacked vertically, the placing of one plenum atop another creates a vertical common plenum, forming a pathway for fresh or heated air to enter or exit a rack of computer systems. The vertical air plenum itself can be coupled to the air inlet or air exhaust system, thereby providing a pathway for fresh air or heated air into or out of the rack of computer systems that include the stack of chassis. Because the chassis design includes two separate computer systems, a computer system can be installed on both sides of a rack. In addition, the design set out herein may be used with chassis designs of standard heights, such as 1 U, 2 U, and larger. In addition, the server design set out herein can also be used with chassis designs that are smaller than 1 U in height. Despite the size of the chassis, the location of the vents in each of the chassis design will be located in the same location in the footprint of the chassis, thereby allowing chassis designs of similar heights or differing heights to be used together to create a common plenum. Other technical advantages will be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 1 is a top, cross-sectional view of a chassis showing the vents of the chassis;

FIG. 2 is a top, cross-sectional view of a chassis showing the vents of the chassis and the components of multiple computer systems;

FIG. 3 is a side, cross-sectional view of a set of chassis 10 in a vertical arrangement; and FIGS. 4 and 5 are side, cross-sectional views of the flow of air through a rack having multiple chassis in a vertical arrangement.

DETAILED DESCRIPTION

Figure 4:
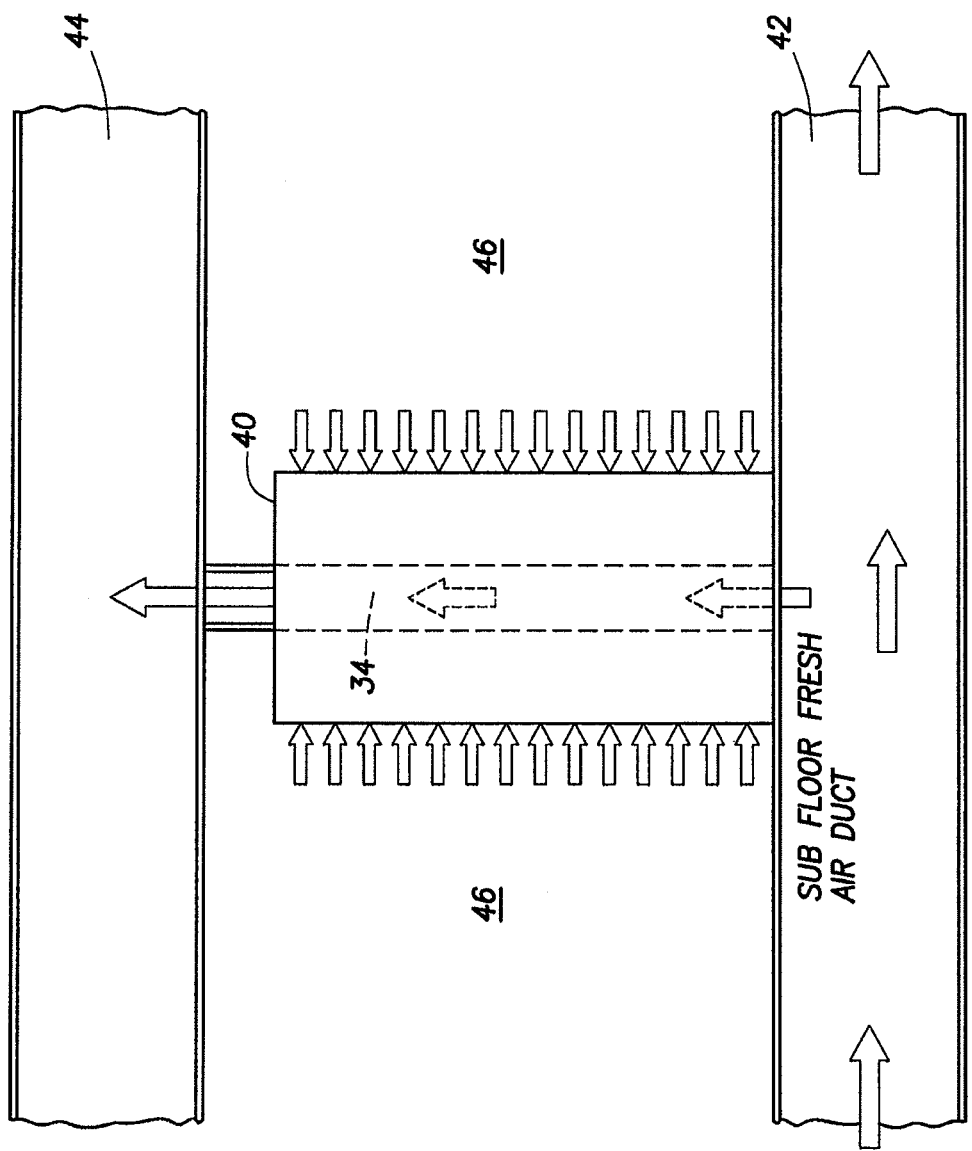

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

Shown in FIG. 1 is a top view of a chassis 10. A chassis 10 has a front 12, a back 14, and two sides 16. Each of the front 12, back 14, and sides 16 are coupled to a base 15. The front 12 of the chassis is characterized as the side of the chassis that includes or is proximate the controls of the information handling system or computer system that are most often accessed by the user. The back 14 of the chassis is opposite the front 12. Included within chassis 12 are vents 18. Each of the vents 18 is an open space that extends through the vertical length of the chassis. The vent is open at its top and bottom such that the vent is open at its base and at the end of the vent that is opposite the base. The opening of each of the vents at the top and the bottom allows air to travel in a vertical direction through chassis 10. The sides 16 of the chassis may also include an open space or aperture 11 at the vents 18 so that air in the vents can exit the chassis in a transverse direction through the apertures in the sides 16 of the chassis 10. The vents 18 are held in place by the bracket or partition 20. The position of bracket 20 also creates first and second enclosures 22a and 22b for first and second computer systems. Each of the enclosures 22 is bounded by the base, sides, and one of the front or back of the chassis. In the view of FIG. 1, a computer system is not shown within the enclosures 22 of chassis 10.

Shown in FIG. 2 is a chassis 10 that includes two separate computer systems 24a and 24b. Computer system 24a is within enclosure 22a and computer system 24b is within enclosure 22b. Each computer system 24 includes a hard disk drive 26, a power supply 28, and a printed circuit board on which other components of the computer system are coupled. Although the each computer system 24 is shown as having a power supply, the computer systems 24 could instead use a distributed power supply associated with a rack system in which one or multiple chassis 10 are included. As shown in FIG. 2, heated air that is generated by the computer systems 24 can enter a vent 18 associated with the computer system. As shown, and considering that air is a fluid, each computer system 24 is in fluid communication with one of the vents 18. Once the heated air is in the interior of vent 18, air can travel vertically through the vent. In addition, if lateral apertures are included in the vent, air can travel through the lateral apertures in the vent to exit through the sides 16 of the chassis 10. Because the heated air can travel in the upward or downward direction through a vent, the heated air can travel to the vent of a chassis that is immediately above or below the chassis, or the heated air can exit the chassis through the vertical direction.

By placing two more chassis in a vertical arrangement, a vertical plenum can be created from the vents in the chassis. Shown in FIG. 3 is a side view of chassis 10 in a vertical arrangement. As shown in FIG. 3, the vents of the eleven chassis are aligned, creating a common vertical plenum 34. Also included in FIG. 3 is a distributed power supply 32, which itself includes a vent that is in vertical alignment with the vents of each of the chassis 10. Shown in FIG. 4 is a side view of an example of the flow of air through multiple chassis when arranged in a rack in a data center. A single rack may include multiple chassis, with each chassis installed in one of the slots of the rack.

In the example of FIG. 4, fresh air is passed through a subfloor duct, which is indicated at 42. The air in subfloor duct 42 is identified as being fresh air because it has not been heated by the components of the computer systems of rack 40. Fresh air passes from subfloor duct 42 and upward through the common plenum 34, exiting at the top of the rack, where the air may be evacuated from the room by an exhaust system, including the exhaust system duct indicated at 44. Because heated air exits from the top of the rack, the sides of the rack each form cool aisles 46. A cool aisle is characterized by the fact that the aisle does not include heated air that has not traveled directly from the computer systems of the adjacent rack or racks.

In the example of FIG. 5, heated air is expelled from the common plenum through the sides of the rack 40. In this arrangement, the common plenum 34 includes side apertures or vents that allow heated air to escape through the sides of the racks. In this example, each of the aisles on the side of rack 40 comprises a hot aisle. A hot aisle is characterized by the fact that the aisle includes heated air that has traveled directly from the computer systems to the aisle.

The chassis configuration described herein includes several advantages. The chassis design is in the form of a sleeve that accommodates two separate computer systems, separated from one another by a plenum. Because the server systems can be stacked vertically, the placing of one plenum atop another creates a vertical common plenum, forming a pathway for fresh or heated air to enter or exit a rack of computer systems. The vertical air plenum itself can be coupled to the air inlet or air exhaust system, thereby providing a pathway for fresh air or heated air into or out of the rack of computer systems that include the stack of chassis. Because the chassis design includes two separate computer systems, a computer system can be installed on both sides of a rack. In addition, the design set out herein may be used with chassis designs of standard heights, such as 1 U, 2 U, and larger. In addition, the server design set out herein can also be used with chassis designs that are smaller than 1 U in height. Despite the size of the chassis, the location of the vents in each of the chassis design will be located in the same location in the footprint of the chassis, thereby allowing chassis designs of similar heights or differing heights to be used together to create a common plenum. Although the present disclosure has been described in detail, it should be understood that various changes, substitutions, and alterations can be made hereto without departing from the spirit and the scope of the invention as defined by the appended claims.

What is claimed is:

1. A chassis for a computing system, comprising:
   a back;
   a front;
   sides;
   a central portion including first and second vents and a partition wall, the central portion being positioned within the interior of the chassis and coupled to the base, wherein the positioning of the central portion forms front and back portions within the interior of the chassis, wherein the first and second vents are an open space that extends through the vertical length of the chassis, and wherein the first and second vents are open at each respective base and respective end opposite the base;

a first and second open apertures at the first and second vents, respectfully, wherein positioning of the first and second open apertures permits airflow in a transverse direction through the first and second open apertures;

an opening of the central portion, wherein the opening of the central portion aligns with a subfloor fresh air duct to permit fresh air to pass from the subfloor fresh air duct upward through the central portion;

wherein each of the first and second vents is open at the base of the chassis and in the direction opposite the base of the chassis;

wherein access to the front portion is provided through the front of the chassis and access to the back portion is provided through the back of the chassis; and wherein the first vent is in fluid communication with the front portion of the chassis, and wherein the second vent is in fluid communication with the back portion of the chassis.

2. The chassis of claim 1,
wherein heated air leaves the chassis through the front of the chassis; and wherein heated air leaves the chassis through the back of the chassis.

3. The chassis of claim 1, wherein a computer system is housed within the each of the front and back portions.

4. The chassis of claim 3,
wherein heated air from the first computer system leaves the chassis through the first vent; and
wherein heated air from the second computer system leaves the chassis through the second vent.

5. The chassis of claim 3,
wherein heated air from the first computer system leaves the chassis in an upward direction through the first vent; and
wherein heated air from the second computer system leaves the chassis in an upward direction through the second vent.

6. The chassis of claim 1, wherein the chassis has a 1U size.

7. The chassis of claim 1, wherein the chassis has a size that is a multiple of 1U.

8. The chassis of claim 1, wherein the chassis has a size that is smaller than 1U and wherein multiple chassis can be placed within a slot sized for a chassis having a size of 1U.

9. A chassis for a computing system, comprising:
a back;
a front;
sides;
a base coupled to each of the back, front, and sides;

a central portion including first and second vents and a partition wall, the central portion being positioned within the interior of the chassis and the partition wall being coupled to one of the sides, wherein the positioning of the central portion forms front and back portions within the interior of the chassis, wherein the first and second vents are an open space that extends through the vertical length of the chassis, and wherein the first and second vents are open at each respective base and respective end opposite the base;

a first and second open apertures at the first and second vents, respectfully, wherein positioning of the first and second open apertures permits airflow in a transverse direction through the first and second open apertures;

an opening of the central portion, wherein the opening of the central portion aligns with a subfloor fresh air duct to permit fresh air to pass from the subfloor fresh air duct upward through the central portion;

wherein each of the first and second vents is open at the base of the chassis and in the direction opposite the base of the chassis;

wherein access to the front portion is provided through the front of the chassis and access to the back portion is provided through the back of the chassis; and wherein the first vent is in fluid communication with the front portion of the chassis, and wherein the second vent is in fluid communication with the back portion of the chassis.

10. The chassis of claim 9,
wherein heated air leaves the chassis through the front of the chassis; and
wherein heated air leaves the chassis through the back of the chassis.

11. The chassis of claim 9, wherein a computer system is housed within the each of the front and back portions.

12. The chassis of claim 11,
wherein heated air from the first computer system leaves the chassis through the first vent; and
wherein heated air from the second computer system leaves the chassis through the second vent.

13. The chassis of claim 11,
wherein heated air from the first computer system leaves the chassis in an upward direction through the first vent; and
wherein heated air from the second computer system leaves the chassis in an upward direction through the second vent.

14. The chassis of claim 9, wherein the chassis has a 1U size.

15. The chassis of claim 9, wherein the chassis has a size that is a multiple of 1U.

* * * * *